(12) United States Patent
Parks et al.

(10) Patent No.: US 8,816,253 B2
(45) Date of Patent: Aug. 26, 2014

(54) DUAL INDEPENDENT TRANSPORT SYSTEMS FOR IR CONVEYOR FURNACES AND METHODS OF FIRING THIN WORK PIECES

(75) Inventors: Richard W. Parks, Port Angeles, WA (US); Peter G. Ragay, Anaheim, CA (US); Luis Alejandro Rey Garcia, Long Beach, CA (US)

(73) Assignee: TP Solar, Inc., Paramount, CA (US)

( * ) Notice: Subject to any disclaimer, the term of this patent is extended or adjusted under 35 U.S.C. 154(b) by 401 days.

(21) Appl. No.: 13/352,801

(22) Filed: Jan. 18, 2012

(65) Prior Publication Data
US 2012/0187105 A1  Jul. 26, 2012

Related U.S. Application Data (60) Provisional application No. 61/435,241, filed on Jan. 21, 2011.

(51) Int. Cl.
| | |
|---|---|
| *F27B 9/06* | (2006.01) |
| *H01L 21/677* | (2006.01) |
| *H01L 21/67* | (2006.01) |
| *F27B 9/02* | (2006.01) |
| *F27B 9/36* | (2006.01) |
| *F27B 9/24* | (2006.01) |
| *B65G 25/00* | (2006.01) |

(52) U.S. Cl.
CPC .......... *F27B 9/021* (2013.01); *H01L 21/67736* (2013.01); *H01L 21/67115* (2013.01); *H01L 21/67173* (2013.01); *F27B 9/36* (2013.01); *F27B 9/243* (2013.01); *H01L 21/6776* (2013.01)
USPC .............................. 219/388; 219/390; 414/157

(58) Field of Classification Search
CPC ............ F27B 9/021; F27B 9/243; F27B 9/36; H01L 21/6776; H01L 21/67173; H01L 21/677306; H01L 21/67115
USPC .................. 219/390, 405, 411; 392/416, 418; 414/157
See application file for complete search history.

(56) References Cited

U.S. PATENT DOCUMENTS

| | | | |
|---|---|---|---|
| 2,633,977 A | 4/1953 | McMillan | |
| 2,771,178 A | 11/1956 | Holmburger | |

(Continued)

FOREIGN PATENT DOCUMENTS

| | | | |
|---|---|---|---|
| JP | 2000320977 | * | 11/2000 |
| JP | 2004-286425 A | | 10/2004 |
| WO | WO2008002904 A1 | | 1/2008 |

OTHER PUBLICATIONS

20%-Efficient Silicon Solar Cells with Local Contact to the a-Si-Passivated Surfaces by Means of Annealing (COSIMA), Plagwitz, H. et al., Institut fur Solarenergieforschung GmbH, Hameln/Emmerthal (ISFH), Am Ohrberg 1, D-31860, Emmerthal, DE, Proceedings of 20th European Photovoltaic Solar Energy Conference, Barcelona, Spain, 2005, 4 pages.

(Continued)

*Primary Examiner* — Shawntina Fuqua
(74) *Attorney, Agent, or Firm* — Innovation Law Group, Ltd.; Jacques M. Dulin, Esq.

(57) ABSTRACT

Multi-lane, side-by-side, independently driven transport systems particularly useful for transfer on conveyor belts or finger/chains of thin work pieces, such as silicon wafers, through processing equipment for converting the wafers into solar cells, including UV pre-treaters, dopers, dryers, diffusion furnaces and metallization furnaces. The inventive multi-lane transport systems may employ wire mesh belts having a flying bridge wafer support system comprising longitudinally spaced carrier wire elements that support the wafers at their side edges at only point contacts, by means of opposed, inwardly inclined, downwardly slanted segments or wings. Alternately, finger drives comprising spaced-apart chains having inwardly projecting fingers may be used for transport of the wafers by side edge contact. Friction or sprocket drives having tensioner assemblies associa-ted therewith are used to move the transport belts or finger chains through the furnace zones. Each lane may be independently controlled to provide unique thermal profiles along their processing paths.

20 Claims, 9 Drawing Sheets

(56) References Cited

U.S. PATENT DOCUMENTS

| | | | |
|---|---|---|---|
| 3,299,196 | A | 1/1967 | Lasch et al. |
| 3,828,726 | A | 8/1974 | Dietze et al. |
| 4,516,897 | A | 5/1985 | Snider et al. |
| 4,698,504 | A | 10/1987 | Van Pelt |
| 5,088,921 | A * | 2/1992 | Csehi et al. ............ 432/121 |
| 5,387,546 | A | 2/1995 | Maeda et al. |
| 5,473,978 | A | 12/1995 | Colombo |
| 5,740,314 | A | 4/1998 | Grimm |
| 5,820,679 | A | 10/1998 | Yokoyama et al. |
| 6,288,366 | B1 | 9/2001 | Dings |
| 6,301,434 | B1 | 10/2001 | McDiamid et al. |
| 6,376,804 | B1 | 4/2002 | Ranish |
| 6,460,692 | B2 | 10/2002 | Dionne et al. |
| 6,501,051 | B1 * | 12/2002 | Richert et al. ............ 219/388 |
| 6,566,630 | B2 | 5/2003 | Kitamura |
| 6,841,006 | B2 | 1/2005 | Barnes et al. |
| 6,867,392 | B1 | 3/2005 | Howard |
| 7,514,650 | B2 * | 4/2009 | Melgaard et al. ............ 219/388 |
| 7,805,064 | B2 | 9/2010 | Ragay et al. |
| 7,915,154 | B2 | 3/2011 | Piwczyk |
| 8,007,276 | B2 | 8/2011 | Melgaard |
| 8,039,289 | B2 * | 10/2011 | Parks et al. ............ 438/72 |
| 8,051,629 | B2 * | 11/2011 | Pazdernik et al. ............ 53/442 |
| 2002/0162729 | A1 | 11/2002 | Wheeler |
| 2002/0190052 | A1 | 12/2002 | Kitamura |
| 2006/0246390 | A1 | 11/2006 | Aoki et al. |
| 2008/0012499 | A1 | 1/2008 | Ragay et al. |
| 2010/0220983 | A1 | 9/2010 | Doherty et al. |
| 2010/0267188 | A1 | 10/2010 | Parks et al. |
| 2010/0272544 | A1 | 10/2010 | Rivollier et al. |
| 2011/0013892 | A1 | 1/2011 | Ragay |
| 2011/0188538 | A1 | 8/2011 | Melgaard |
| 2011/0212010 | A1 | 9/2011 | Bell |
| 2011/0306160 | A1 | 12/2011 | Parks et al. |

OTHER PUBLICATIONS

Tecnofimes solid ceramic roller diffusion furnace, www.tecnofimes.con/photovoltaic, May 26, 2010, 2 pgs.

SierraTherm XR Series Roller Hearth Diffusion Furnace, www.sierratherm.com/process-applications/solar-cell, 5 pgs, May 26, 2010.

* cited by examiner

DUAL INDEPENDENT TRANSPORT SYSTEMS FOR IR CONVEYOR FURNACES AND METHODS OF FIRING THIN WORK PIECES

FIELD

The invention is directed to furnace conveyor systems, and more importantly to dual, side by side, independently driven transport systems particularly useful for transfer on conveyor belts of thin work pieces, such as silicon wafers, through processing equipment for converting the wafers into solar cells, including UV pre-treaters, dopers, dryers, diffusion furnaces and metallization furnaces. The inventive transport system may use a wide range of conveyor belts, including a wire mesh belt having a flying bridge wafer support system comprising longitudinally spaced carrier wire "wing" elements that support the wafers at their side edges in only point contacts by means of opposed, inwardly inclined, downwardly slanted wafer support segments.

BACKGROUND

The fabrication of silicon-based photovoltaic solar cells from thin silicon wafers, typically 140-180 micrometers thick, requires multiple processing steps, including a 2-stage diffusion process to create a semi-conducting "p-n", junction diode layer, followed by screen-printing "solder paste" coatings on the wafer front and back sides which are fired into the p-n junction or back contact layer, where they act as ohmic collectors and grounds, respectively.

The diffusion process includes coating the wafer with a phosphoric or/and boric acid composition, followed by firing in a diffusion furnace to create a P-doped p/n junction photovoltaic layer on the front side, or/and a B-doped contact layer on the back side. After diffusion and various cleaning steps, the wafers are coated with an Anti-Reflective Coating (ARC), typically silicon nitride ($SiN_3$) which renders the wafers deep blue or brown, depending on the ARC coating used.

To form a back contact ground layer, the wafer back surface is coated with an Al-based paste. The wafer top surface is screen printed with a fine network of Ag-based paste lines connected to larger buss conductors to "collect" the electrons generated. After these pastes have been dried, they are "co-fired" at high temperature in an IR lamp-heated conveyor-type metallization furnace.

Currently available IR conveyor furnaces for such processing steps are single line, that is a single conveyor belt or roller system that conveys the wafers through the processing step, single file. All wafers are processed according to the same processing schedule and dwell time in each processing zone. To double production requires buying and installing a second line of a multiplicity of modules arranged end-to-end. Each module has its own drive, its own transport system, its own framework including sides top and bottom, and requires the same factory floor-space foot print. To double production requires double the factory real estate and double the capital equipment for the processing machinery and the operating personnel.

For example, in the case of diffusion firing processes, the furnaces have a long heating chamber in which a plurality of IR lamps are substantially evenly spaced apart (typically 1.5" apart) both above and below the wafer transport system (wire mesh belt or ceramic roller conveyor). The heating zone is insulated from the outside environment with various forms of insulation, compressed insulating fiber board being the most common. The infra-red (IR) lamps increase the temperature of the incoming silicon wafers to approximately 700° C. to 950° C. This temperature is held for the 30-minute duration of the diffusion process, after which the wafers are cooled and transferred to the next downstream process operation and equipment.

Currently available conveyor-type liquid dopers (as distinct from the muffle tube and carrier-type POCl3 gas dopers) employ solid or elastomeric band conveyors on which the wafers travel. The wafers are adhered to a peel-off disposable paper backing to protect the wafer back side against doping chemical exposure. These are non-conductive conveyor systems, which involve the extra step of wafer handling to remove the paper backing.

Currently available diffusion furnaces typically employ one of two types of wafer transport systems: 1) a plurality of static (not-longitudinally moving), solid ceramic, rotating rollers; or 2) active (longitudinally moving) wire mesh belts, to convey the wafers through the furnace firing zone. Static, ceramic rotating-roller furnaces currently are preferred in order to minimize or prevent metallic contamination of the back surface of the wafers.

A typical conventional diffusion furnace is on the order of 400" long, having 160, 36"-wide IR lamps placed above the rollers, with from 100-160 placed below. The total mass of the conveyor rollers is on the order of 800 lbs, and is classified as a high-mass conveyor system.

As the demand for solar cells increases, the rates of production must increase, either by process improvements or adding furnaces into service. With respect to adding furnaces, conventional furnaces have a large footprint. Thus, adding furnaces requires increased capital outlay, for buildings, the furnaces themselves, and related service facilities.

In the case of wire mesh belts used in the metallization furnaces, the mesh belts must be supported beneath the belts to prevent sagging. Long-standing practice in the industry is to provide supports comprising pairs of opaque, white quartz tubes, typically on the order of 2-3 cm in diameter, placed with their long axes parallel-to or slightly canted to the direction of travel of the belt, e.g. in a staggered converging or diverging (herringbone) pattern. The quartz tubes are smooth, and provide line contact surfaces on which the underside of the belt slides as it conveys the printed wafers through the metallization furnace processing zones. To minimize shadowing by the tubes, the practice has long been to angle the tubes, either converging or diverging along the line of travel so that the same portion of the wafer was not shadowed the entire duration of travel through the furnace. The shadow effect is reduced by this long-used trick of angling the support tubes, but not eliminated, because now the entire wafer is in shadow at least some of the duration of transport through the furnace. In effect, the shadow lines are there, less pronounced and more diffuse, but broader.

In addition, the contact of the back side of the wafer with the many wires of the conveyor belt contributes to abrasion and contamination of the back contact layer paste during the metallization firing process. In an attempt to minimize this problem, current conveyor belts employ "pips", which raise the wafer a few millimeters above the belt. The pips are made by bending a plurality of loops of the wire mesh belt upward of the top plane of the belt. However, the wafer bottom still rests directly on the pips, on the order of 10-20 per wafer, and they still move laterally and forward or back on the order of a millimeter in each direction during the transport of the wafers through the processing zones. This results in reduced throughput, due to discarding pip-damaged and contaminated wafers Thus, the need for faster production and greater throughput, while curbing facility capital outlay, is not met by the current state of the art quartz tube-supported metal belts having wafer support pips. In order to compensate, conveyor-type dopers and furnaces have been made laterally wider, so that multiple lines of wafers can be processed in each process zone. In the case of furnaces, this in turn requires longer, more expensive lamps which typically experience a substantially shorter mean time to failure, thus significantly increasing operating costs.

Since there are dimensional and IR lamp cost constraints, increasing lamp density in the furnace is not generally a feasible solution. Likewise, increasing the power to the lamps is not currently feasible because higher output can result in overheating of the lamp elements, as a result of the thermal mass of the furnace, principally in the high mass solid ceramic roller conveyor system. Overheating particularly affects the external quartz tubes of the lamps. Most furnaces are thermocouple controlled. Since the IR lamps are placed side by side, on the order of 1.25" apart, each lamp heats lamps adjacent to it. When the thermocouples detect temperatures approaching the selected diffusion or sintering temperature set point in the 700-950° C. range, they automatically cut back power to the lamps by an amount that depends on the thermal mass of the transport system (rollers or metal mesh belts and quartz tube supports). This lower power density is accompanied by substantial changes in the spectral output of the IR lamp emissions (hence a lower light flux and energy output). In turn, this reduced light flux results in the need to slow down the conveyor belt speed or lengthen the furnace (while maintaining the original belt speed), thus slowing processing. Overheating of lamps, e.g., due to thermocouple delay or failure, can cause the lamps to deform, sag and eventually fail. Lamp deformation also affects uniformity of IR output delivered to the wafers.

Accordingly, there is an unmet need in the wafer processing art to increase production at costs that are less than the unit cost of duplication of process lines. In addition, in the diffusion to and metallization furnace and firing process art there is an unmet need to significantly improve net effective use of firing zone(s) by reduction in wafer pip damage and contamination, permit-ting improved utilization of firing energy, improving the speed and uniformity of the firing process, reducing furnace size while retaining or improving throughput, and accomplishing these goals on a reduced furnace footprint, and lower energy, operating and maintenance costs.

THE INVENTION

Summary, Including Objects and Advantages

The inventive thin work-piece transport system comprises multiple independent, side-by-side conveyor drive systems in a single frame-work, thus eliminating two side walls as compared to the ordinary practice of duplication of a line of process equipment in order to double production. Each line may be driven in synchrony with the other, or may be driven on its own, independent schedule. Thus, for example, in an exemplary dual-line system, wafers of different sizes may be processed in the same UV pre-treater, doper, dryer, diffusion furnace or metallization furnace at different rates of travel. Herein these equipment modules are termed "processors".

Each of the side-by-side lines includes its own drives, sensors and control systems, including computerized control computers having input devices and display devices that are individually configurable to operate on a unique operating schedule. The inventive transport systems include left and right side transport support members (walls) and a common, relatively thin center support member (divider wall). Each line is accessible from above for adjustment, maintenance and repair, as the equipment module has a common top half that is raised on corner linear actuator jacks in a "top lift" configuration. Likewise there is a common bottom half.

Both the top half and the bottom half are divided longitudinally along the path of process transport of the conveyor systems with separation walls that define the two process lines, respectively. The lower half separation wall comprises the common center support for the two side-by-side transport systems, one for each line. The upper half separation wall lies in the same vertical plane as the common center support separation wall. In the case of furnaces the centerline walls are insulated so that each line may have developed therein its own individual, independent, unique thermal profile along the individual line work piece transport process paths. This thermal independence may be implemented, for example by using dual zone transverse IR lamps, running the entire width of both lanes, or each lane may have its own number of lamps that only span the width of its line. In another implementation, each zone of each line may have the same number of lamps that are powered in accord with a particular power schedule for each line. Or the number of lamps and/or their placement, that is distance apart along the processing to path may be different.

Each line has access from only one side via the top lift functionality of the lifting jacks. The common but longitudinally divided bottom half of the furnace is static, neither lifting nor dropping, and the equipment upper and lower halves are defined above and below, respectively, the horizontal plane of both process line conveyor belts of the dual transport system. Thus, when the upper half is lifted, the conveyor belts are fully accessible.

Conceptually, the result is the difference between two stand-alone dwellings each with individual side, end and top walls, as compared to a duplex building that eliminates two facing side walls. There is an evident savings of materials of construction by elimination of one wall from each line and joining them together. Likewise, the factory floor foot print is not doubled because the common center aisle between two independent single-wide lines is eliminated.

With respect to the conveyors of the transport mechanism, it is preferred to move both belts through the processor (e.g., furnace) with a pull-through drive geometry. In the preferred embodiment, each line has its own drive motor and sinusoidal belt path drive drums, rollers or sprockets. The entry and exit ends of the processor include a belt redirecting roller system comprising a roller for each of the belts mounted on its own shaft. The two shafts are co-axially aligned, but separated by a common journal bearing at the center wall. The processor typically will have a single-wide take-off belt or conveyor assembly that spans the width of both lanes.

In a first embodiment, which is discussed herein as an implementation example for a metallization furnace, each conveyor belt of the inventive dual-lane transport system and furnace apparatus comprises a full-process path width, continuous spiral wire mesh belt, having a plurality of longitudinally spaced-apart wire wafer carrier elements that support wafers above the belt by point contact of the wire with the juncture of the wafer bottom and a side edge. The wire carrier elements include a pair of vertical riser segments, each secured to the belt adjacent an outer edge, the upper ends of which bend inwardly and downwardly toward the center of the belt in an inclined work piece product support slant segment, together called a "wing". The two wings may be joined by a horizontal center segment. The slant segments each extend transversely (laterally) across approximately 10-20% of the belt and join a center segment. The center segment comprises 60-8% of the belt width.

Each end of each carrier wire is mounted to the belt at the base of the wire vertical riser segments, and the center of the center segment. The carrier wires extend above the belt, and are disposed at regular intervals along the longitudinal length of the belt to support the thin work pieces (e.g., wafers) above the woven wire comprising the belt mesh. The belt is engaged by a drive system that moves the belt in a horizontal plane that defines the processing path through the furnace. The slant product support segments of the carrier wires are spaced apart laterally a sufficient distance so that opposite wire inclined slant segments each support one side edge of a wafer as it is transported through one or more processing zone(s). In the exemplary implementation described herein, the wafers are silicon wafers transported through one or more processing zones during conversion to solar cells, e.g., UV pre-treating, doping, drying, diffusion firing and metallization firing. However, the inventive carrier wires may be used to transport any thin work-piece that requires minimal contact with one or both face surfaces of the work-piece.

For each line of the dual line side-by-side transport system, each of which is a processing line for a single file of wafers, two spaced slant segments are used, a right side incline and a left incline, as seen in end elevation. In one exemplary embodiment, the slant segment inclines are the hypotenuses of right triangles, the base of which is the wire mesh belt itself. The hypotenuse of the right side carrier wire extends to the left toward the processing path centerline, and the hypotenuse of the left side carrier wire extends to the right toward the processing path centerline.

In a first embodiment, the carrier wire wing elements (vertical segments plus inclined slant segments) are independent, spaced apart and aligned in the same vertical transverse plane across the belt. In this embodiment, the wing inclined slant and vertical segments are considered as spaced pairs of carrier wire elements.

In a second embodiment, the two carrier wire wing elements are joined at the bottom of the inclined slant segments, that is, the inner end of the hypotenuses, by a center segment that acts as a lateral width spacer, so that a single, continuous carrier wire extending across the belt width forms all three segments, the center connector segment, the wings, comprising the two inclined slant segments and the vertical riser segments. The single carrier wire element is welded to the belt mesh wire at a short horizontal tail segment at the base of each vertical segment and at the center of the center spacer segment. Accordingly, a wire mesh conveyor belt having the continuous carrier wire elements is colloquially termed a "flying bridge" belt, as the wire carrier elements are above and spans one side of the belt.

Thus, the carrier wires may be implemented as separate wing pairs, or single, continuous elements having two, laterally spaced, facing, inwardly inclined, product segments joined by the center wire. In the case of the pairs of spaced wings, four welds are employed to secure them to the wire mesh of the belt.

The opposed inclined hypotenuse slant segments of the wings may be aligned or staggered longitudinally along the mesh belt. Thus, the slant segment extending inwardly from the right side of the belt may be secured to odd numbered mesh rows 1, 3, 5, etc, while the slant segment extending inwardly from the left side of the belt may be coordinate, that is, secured to the corresponding same odd numbered mesh rows, or may be staggered with respect to the right to slant segment, secured to even numbered chain rows 2, 4, 6, etc. In addition, while for flexibility of the belt, the carrier wire elements are preferably secured to the same mesh row, they may be angled forward or back by one or more rows, or the longitudinal width of one row. In that embodiment, the right side tail would be welded to row 1, the center to row two, and the left side tail to either row 1 or row 3.

The inventive dual lane transport system also includes a "quad" embodiment. In this embodiment, a pair of double-wide belts are used, which results in one furnace having a side-by-side pair of two-lane wide belts, resulting in a 4-lane processor.

In the case of a two-lane wide belt, where pairs of wafers advance through the processing zones in a side-by-side relationship, a double inclined slant segment center member is used. In this embodiment, the left and right wings are as above, and the center comprises the two sides of a truncated equilateral triangle, or an equilateral trapezoid. That is, an elevated spacer segment is used in the center. In the alternative, two flying bridge carrier wire elements are used, with the left tail of the right side line being a continuation of or joined to the right tail of the left side line suspension member. In another alternative, the right lane and left lane of the two-lane belt are simply formed by a pair of side-by-side, complete single-lane carrier wire elements being welded to the belt in proper orientation. In this latter embodiment, Lane A carrier wire element are welded to odd-numbered mesh rows, and the Lane B carrier wire elements are welded to even-numbered mesh rows. Finally, two pairs of wings may be used. However, for ease of manufacture it is best that the double carrier wire elements for two or more lane belts (double, triple, quad belts) are formed of a continuous wire across the belt, as a continuous wire maintains proper lateral spacing.

The incline segments of the suspension members are long enough to be universal. That is, the height, lateral spacing and the angle of inclination of the inclined segments are selected to permit carrying a wide range of wafer widths, e.g., 5", 6", 8" and so on. The belt material for furnace applications is a high-temperature wire, such as Stainless Steel, Nichrome (preferred) or Inconel wire of diameter in the range of 0.050" to about 0.1", with the preferred range of 0.064" to 0.092", depending on service requirements. The carrier wire may be the same material and gauge as the belt, in order to simplify the welding operation.

In addition, if desired to use the wings or flying bridge belt in a diffusion furnace or a doper, the carrier wire may be passivated, e.g., by coating with TiN, or the inclined segments may be covered with a tube or coating of ceramic, quartz, zirconia or high temperature glass. For dopers, which operate at low temperature but in corrosive chemical atmosphere, e.g., ortho-phosphoric acid, the wire of the belt and wing or flying bridge carrier wire elements may be of Stainless Steel (SS), optionally nitrided, e.g., treated with a vapor deposited coating of Titanium and then nitrided to form a TiN coating. For diffusion furnaces, the belt and carrier wire forms can be TiN passivated Nichrome and the inclined segments fitted with ceramic, zirconia or quartz tubes.

Typically the carrier wire "bridges" or wing pairs are spaced apart with respect to the work piece being transported so that there are two or more inclined segments supporting each wafer side edge. In the case of a 6" silicon wafer, 3 or 4 inclined segments support each edge of the wafer so that it is transported stable and level through the process zones. Thus, the belt mesh rows are on the order of 2-4 cm in length and the carrier wire inclined segments are spaced apart longitudinally a similar dimension.

The wing or bridge carrier wire elements may take a wide range of configurations. In the exemplary presently preferred embodiment disclosed herein, the hypotenuse inclined segments are angled downwardly on the order of 5°-45° so that the bottom corner of the wafer edge contacts the upper edge of the incline, the wires being round in cross-section. Where the fingers in cross-section are round or triangular (with the point upward), e.g., wires, the wafers are supported by minimal point contact.

In the case of diffusion furnaces where metal mesh belts currently are not used due to contamination of the wafers by the metal belts in contact with the underside of the wafers, the inventive carrier wire wing or "flying bridge" belts may be fitted with small ceramic tubes slipped over the inclined segments. The edges of the wafers contact the ceramic tubes rather than the wire of the incline, thereby eliminating a source of contamination. In still another embodiment, the inclined segments may be coated with glass, of the type formulated to bond with metal, such as radio tube glass. In the alternative, the inclined segments may be coated with a formulation of powdered glass or ceramic plus a binder, and then fired to form a glass or ceramic frit-type coating. It will be evident to one skilled in this art that a wide range of wing and flying bridge designs may be employed while keeping within the scope of the principles of this invention.

In an important alternative, massless, shadowless finger drive systems may be used in each lane. Such drives comprise spaced-apart chains, preferably roller-link chains having single or double fingers mounted in the hollow chain pivot tubes, which fingers project toward each other. The finger chains are spaced apart just enough so that wafers are carried along the processing path only by point contact of the finger wires with a bottom side edge of the wafers. This drive system is shadowless, in that it eliminates the need for quartz sliders or tubes which are used in the case of wire mesh belts, is more energy efficient and permits faster processing of wafers as more radiant energy is delivered to both sides of the wafers simultaneously. Indeed, rates of travel of wafers transported on finger drives approach or exceed 500" per minute, permitting dwell time in transiting a peak firing zone on the order of 1 second or less, which is in the range of from about 2× to 10× faster than currently available furnaces.

BRIEF DESCRIPTION OF THE DRAWINGS

The invention is described in more detail with reference to the drawings, in which.

DETAILED DESCRIPTION, INCLUDING MODES OF CARRYING OUT THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including several implementation best modes of carrying out the invention.

Figure 1:
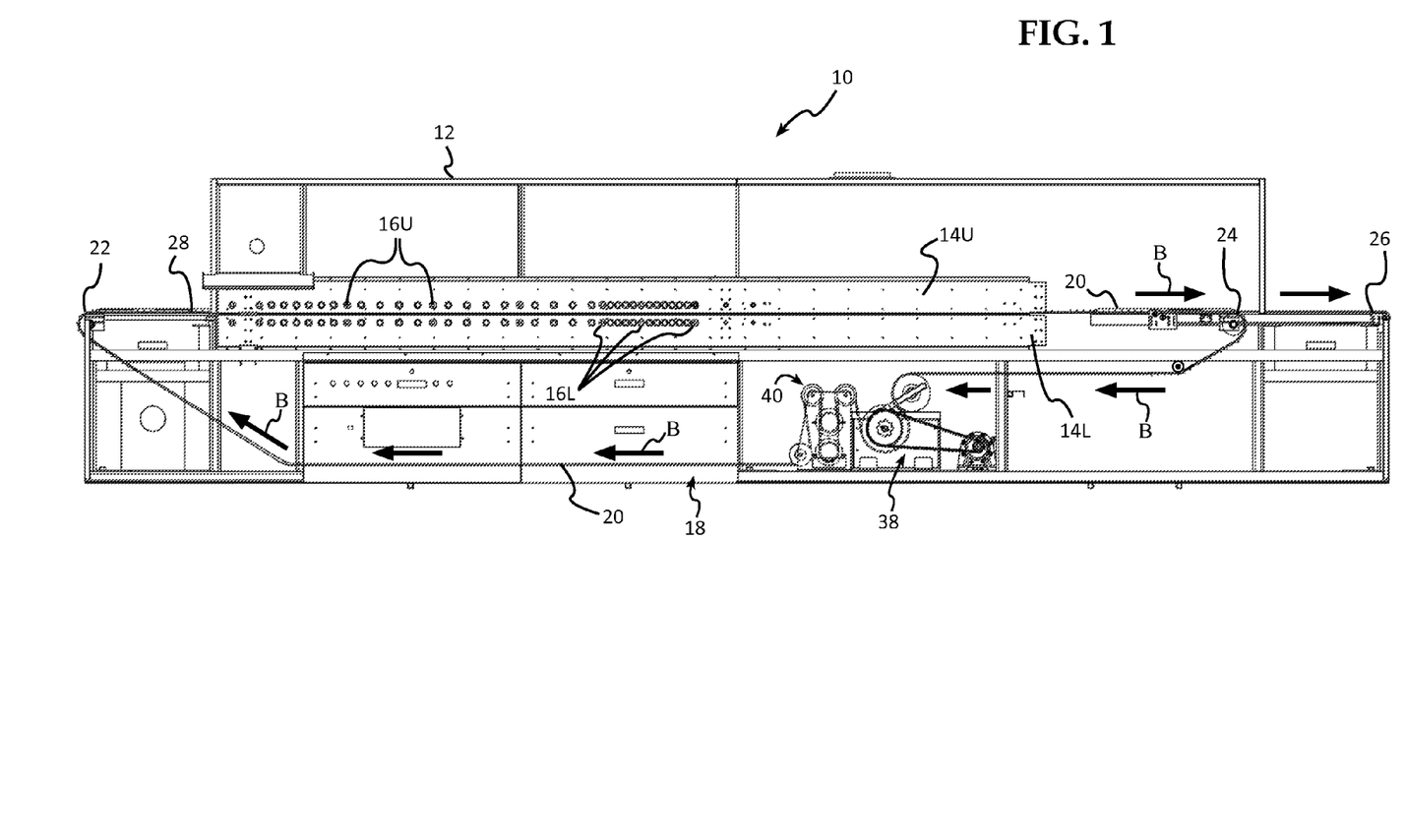
FIG. 1 is a longitudinal side elevation of a first embodiment of the inventive multi-lane furnace showing the belt path and exemplary pull-through drive system.

FIG. 1 shows a first embodiment of the inventive furnace 10 having a dual independent transport system 18, in this example shown as implemented in an IR lamp-heated conveyor furnace for treatment of thin Si wafers in at least one step of the process of converting them to solar cells. The work pieces, thin Si wafers 28, enter on the left and exit, after processing, on the right in FIG. 1, the heavy Arrows B showing the direction of travel during processing and return of the wafer transport belts.

The inventive transport system comprises a framework 12 supporting a fixed bottom half 14L of the furnace assembly, and a top half 14U that is vertically liftable on linear actuators, one disposed at each of the four corners of the furnace assembly, thereby defining a "top-lift" type furnace. The modular furnace processing zones are heated by IR high-intensity lamps 16, spaced apart longitudinally along the processing path of the Arrows B pointing to the right. The upper half lamps are designated 16U, and the lower half 16L. As can be seen in FIG. 1 the spacing-apart of the lamps varies from zone to zone as required to provide the radiation intensity suitable to generate the heat needed in each particular zone. Thus the designator 16L points to closely clustered lamps in the peak heating zone, while other lamps to the left are farther apart in the preheat zone, identified with designator 16U, or absent to the right in the cool-down zone.

The furnace includes a programmable computer control system that includes preselected or configurable thermal profiles for precise temperature gradients on a lane-by-lane, zone-by-zone, upper and lower furnace halves, basis for the full length of the processing path. A fill-in template system is preferably used for configuring each lane independently of, or identical to, the other. Each lane has its own, separate, transport drive system that is independently controllable of the other for transport speed. The number or spacing of lamps in Lane A may be different than the number in Lane B. Or, where the number of lamps is the same in both Lanes, the power provided to lamps in one lane may be different than the other, on a zone by zone basis. Thus, each zone of each Lane is individually and independently configurable and controllable as needed to provide a unique thermal profile along the entire processing path for a particular product being treated or processed (e.g., fired).

The inventive apparatus includes a dual belt drive system 18, in this preferred embodiment shown implemented as a dual independent, pull-through drive 38 and tensioner 40 disposed below the lower half of the furnace assembly 14L. The drive belts 20, described in more detail below with reference to FIGS. 2-11, are guided over redirecting idler rollers 22 and 24 at the inlet and exit ends, respectively, of the furnace 10. At the exit end, the wafers transition onto a take-off belt 26

Figure 2:
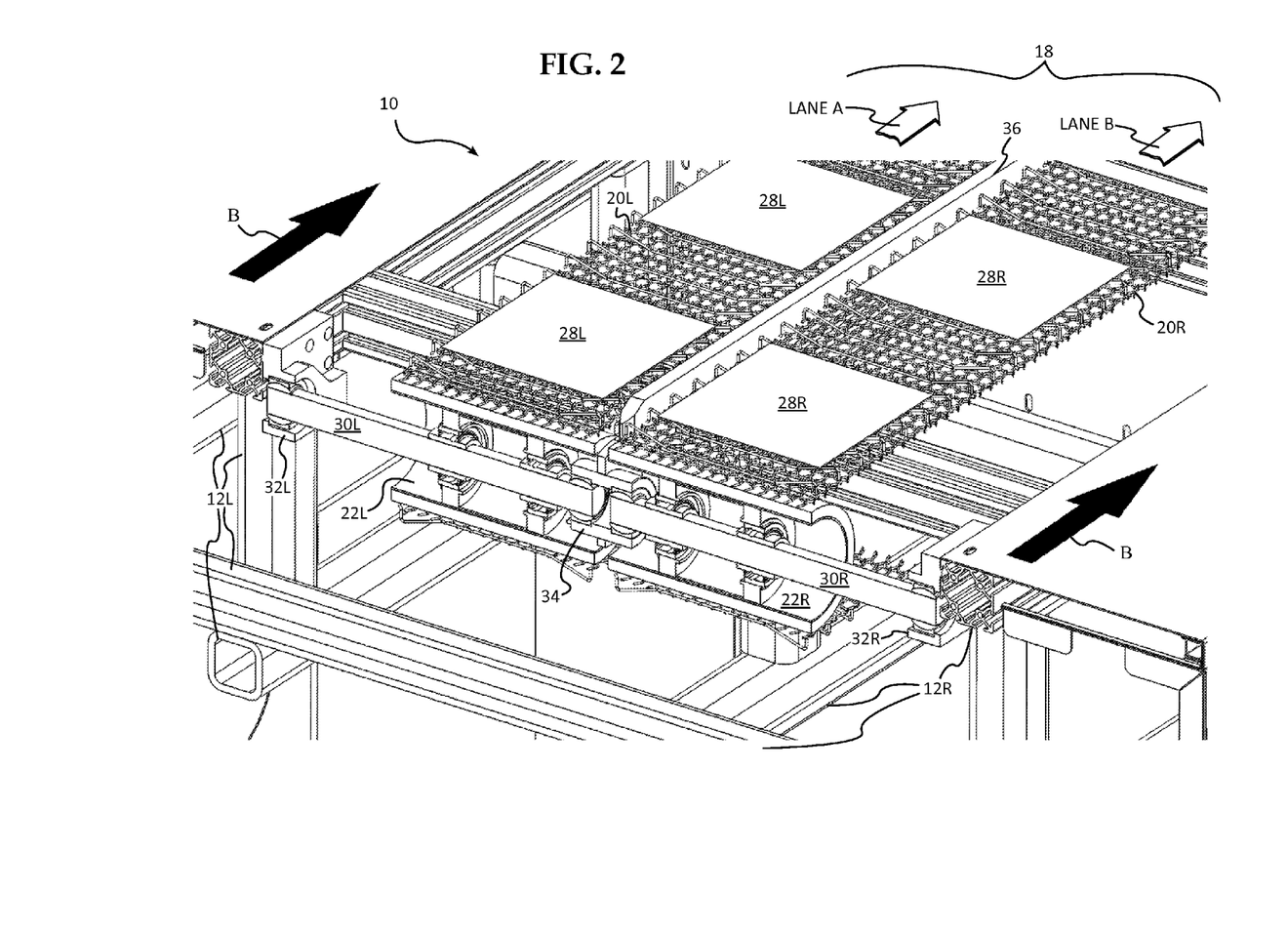
FIG. 2 is an isometric view, partially broken away, showing the inlet end of the furnace with dual side-by-side processing paths each employing an exemplary wire mesh belts having carrier wire flying bridges to support wafers at spaced points along their side edges.

FIG. 2 shows in isometric various elements of the frame assembly 12 of furnace 10, 12L forming the right side of the furnace framework, and 12R forming the right side. The heavy Arrows B on left and right show the direction of travel of the wafers through the processing zones of the furnace. Wafers 28L are shown on the Lane A transport belt 20L and wafers 28R are shown on the Lane B transport belt 20R. The idler rollers, 22L for Lane A, and 22R for Lane B, are mounted on independent, but co-axially aligned shafts 30L and 30 R. Each shaft 30 is mounted at their respective outboard ends in a bearing housing assembly 32L and 32R, secured to its respective side wall, 12L and 12R. The inner ends of the two shafts 30L and 30R are mounted in a common bearing housing 34 which is secured in the left, entry end of a center, belt "divider", wall 36.

Figure 3:
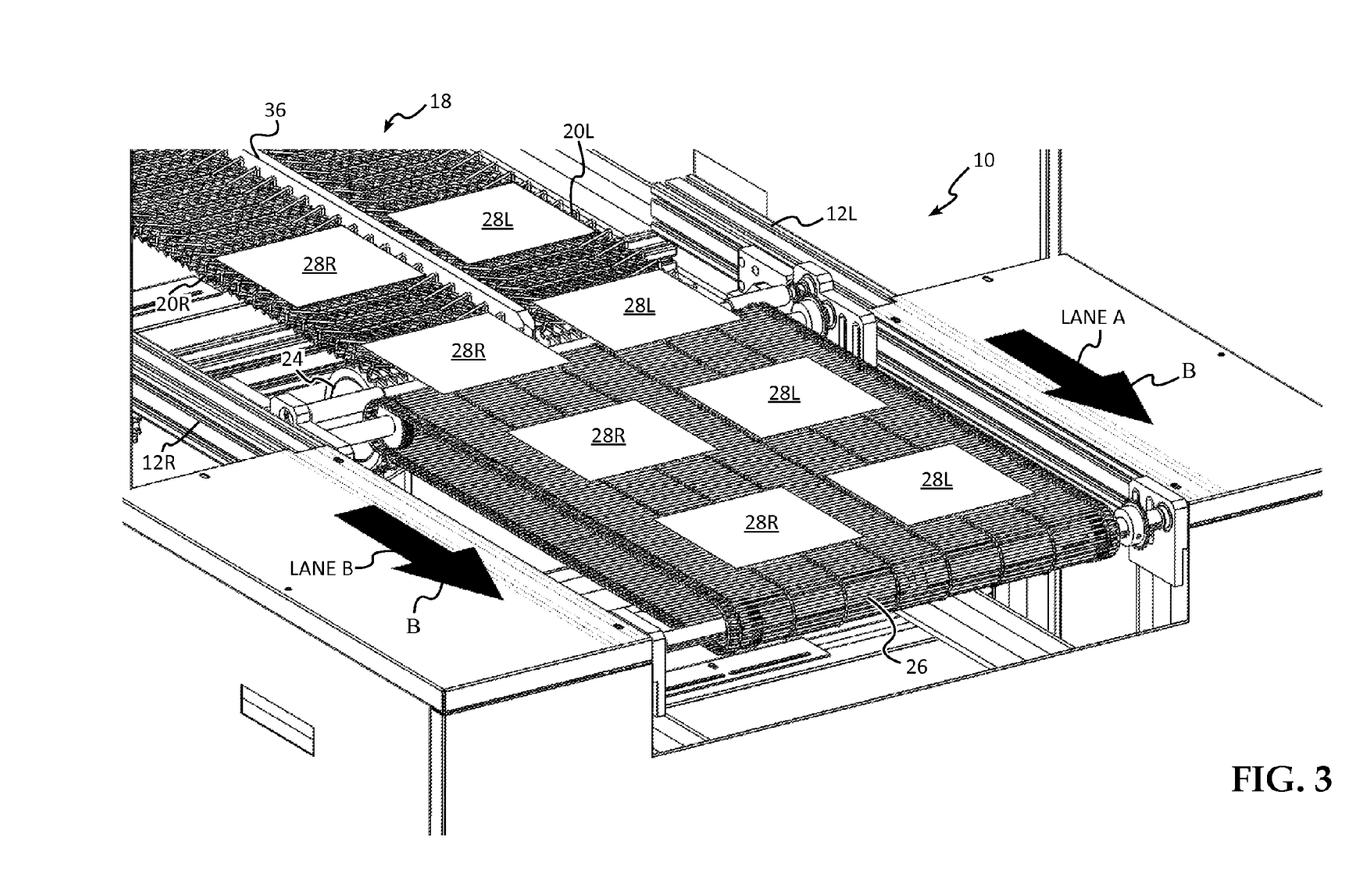
FIG. 3 is an isometric view of the inventive dual independent transport system implemented in a furnace showing the outlet end and transition to a common take-off transfer belt assembly.

FIG. 3 shows the exit end of the furnace assembly 10, identifying the Lane A and Lane B belts 20L and 20R, respectively, the redirection exit idler assembly 24 and the feed of wafers 28L and 28R onto the common take-off belt 26.

Figure 4:
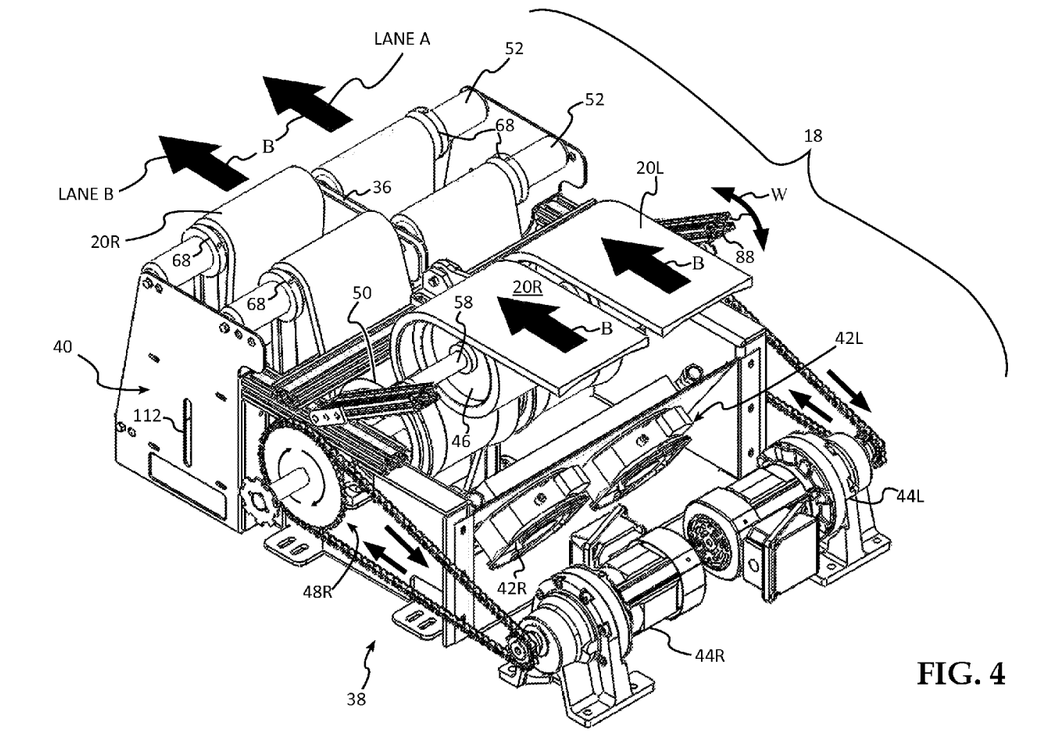
FIG. 4 is an isometric view showing dual independent drive system apparatus from the inlet end as they pull their respective transport belts off the output end of the furnace in the return path direction.

FIG. 4 shows the dual belt drive system 18 from the exit end of the furnace, which on the belt return direction, shown as Arrows B, is the entry end of the drive and tensioner assemblies 38, 40. The drive system includes a drive assembly section 38 and a tensioner/take-up assembly section 40. The latter also adjustably accommodates for different length belts for furnace assemblies having different number of zone modules. This tensioner/take-up section includes an upper pair of rollers 52 that are spaced apart for belt-length slack loop 56 (best seen in FIG. 7), and a lower redirection idler roller 54 (best seen in FIG. 5). A pair of fans 42L and 42R cool the respective belts 20L and 20R, and each Lane has its own drive motor 44, connected to their respective drive drums or rollers 50 via a drive chain and sprocket assembly 48. The incoming belts 20L and 20R are redirected around adjustable position wrap or pinch rollers 46 to the drive drums 50. Spacing between the belts is maintained by the center, belt divider wall 36, and tracking is maintained by collars 68.

Figure 5:
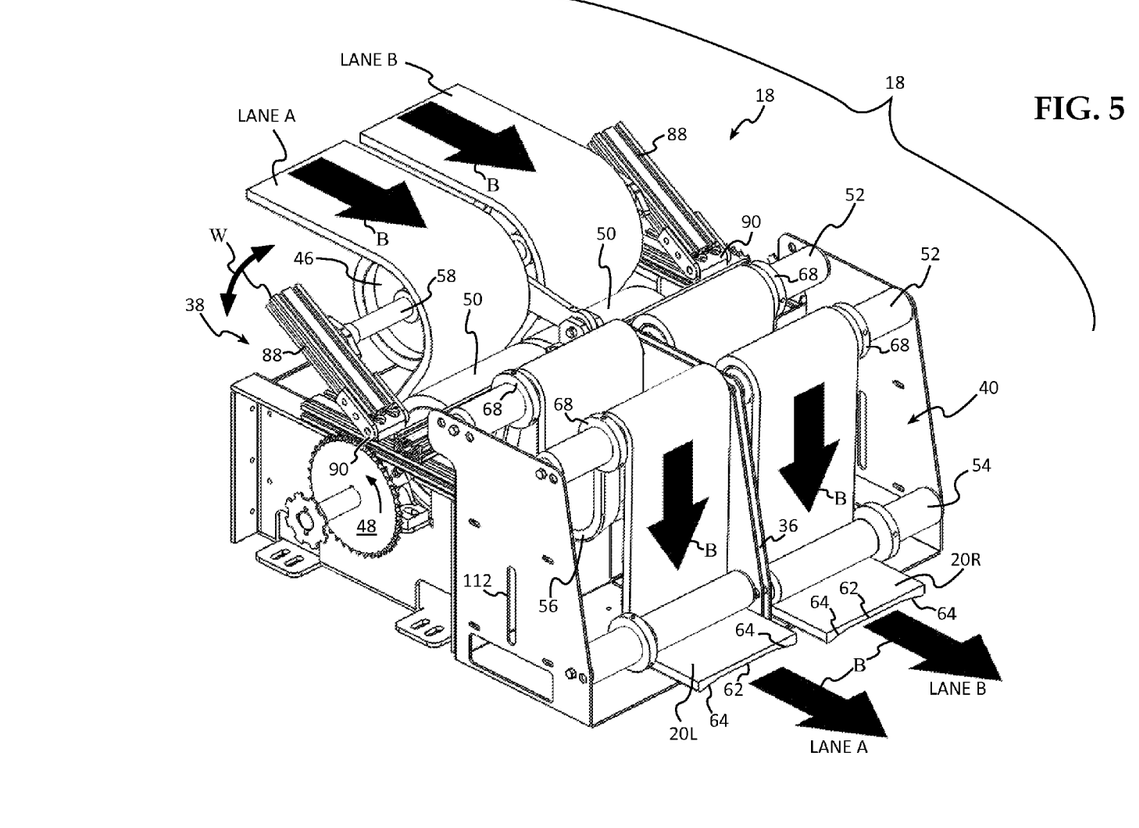
FIG. 5 is an isometric view from the opposite viewpoint as FIG. 4 showing the outlet end of the dual independent drive systems showing the tensioner apparatus.
Figure 7:
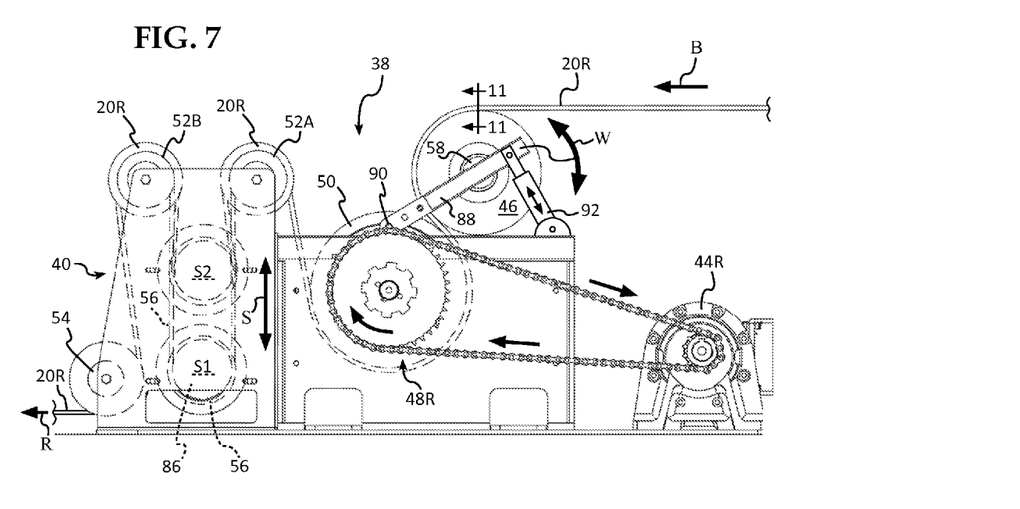
FIG. 7 is an enlarged side elevation of the drive and tensioner apparatus illustrating the wrap and floating tensioner roller apparatus.

FIG. 5 shows the dual belt drive system 18 from the opposite corner, that is from the entrance end of the furnace, which on the belt return direction shown by Arrows B is the exit end of the drive assembly. The tensioner/take-up section 40 idler roller assemblies, upper pairs 52 and lower pair 54, are more easily seen in this view and the belt hanging loop 56 is a variable length loop between the two upper pairs 52. As best seen in FIG. 7, the loop 56 is maintained by a freely rotating roller 86, the center shaft of which is confined to move vertically in slot 112 in each side wall of the tensioner/take-up section 40.

Figure 6:
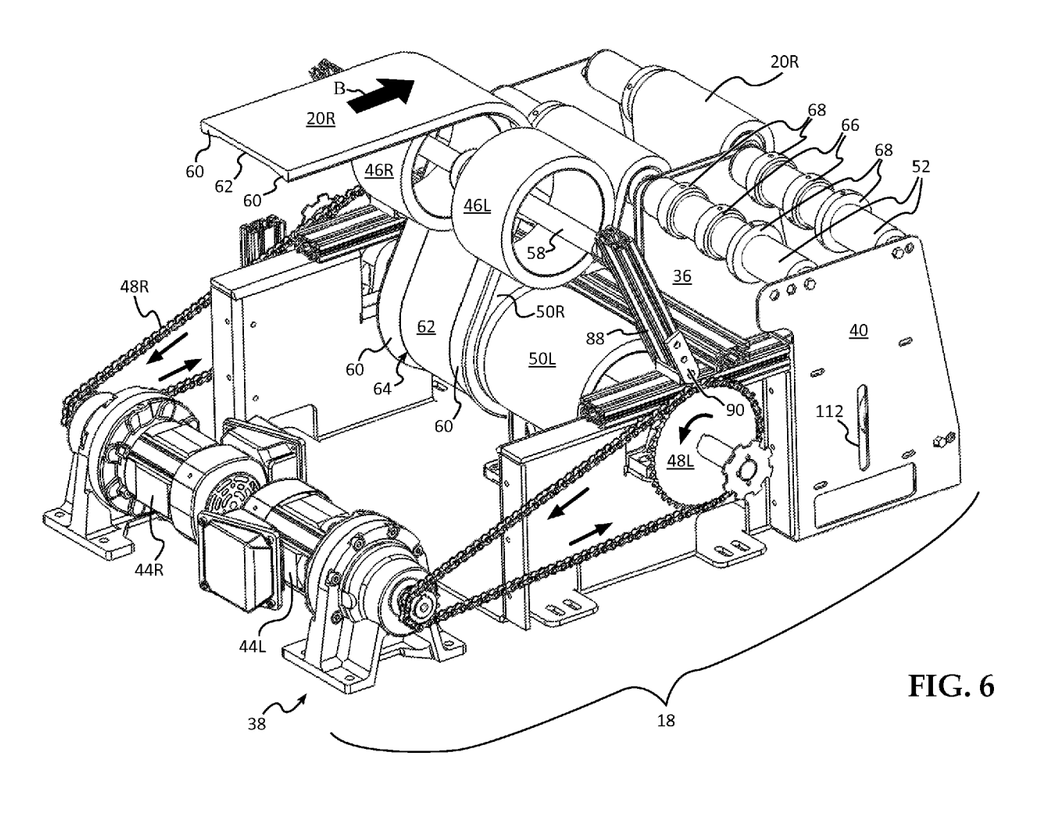
FIG. 6 is an isometric view from the left output side of the dual independent drives, with one belt removed to show how the drive drums handle the inventive carrier wire flying bridge elements without damaging them.
Figure 11:
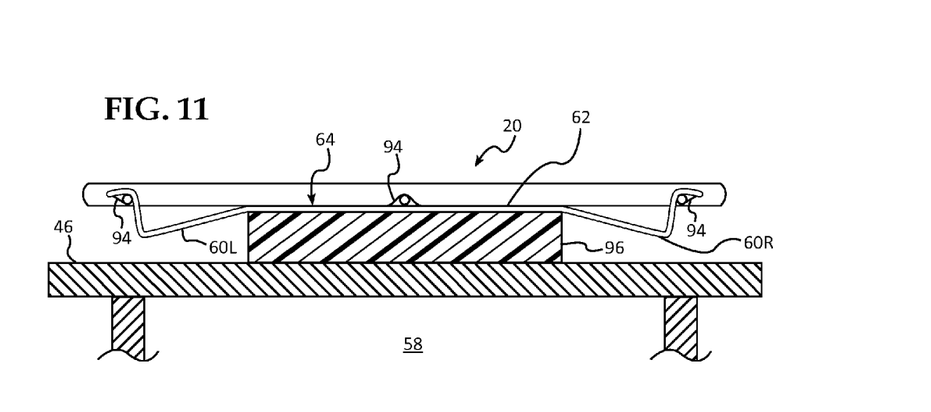
FIG. 11 is a vertical section taken through line 11-11 of FIG. 7 showing how the wrap roller pad is configured to handle the inverted belt without damaging the belt carrier wires.

FIG. 6 shows the dual belt drive system 18 from the left side with the Lane A, left belt 20 L removed, while the Lane B, right belt 20R is shown. Note the wrap drums 46 are independent and mounted on co-axially aligned shafts. The pads 96 (seen in FIG. 11) on the drums or rollers 46L, 46R are narrow in width so that they contact only the horizontal middle segment 62 of the carrier wire elements 64, and not the inclined segments 62, since the carrier wire elements 64 face downwardly on the return path. This is best seen in FIG. 11. Note the bottom of the belt is in contact with the friction drive drums 50R and 50L which are the full width of the belt. With respect to the idler rollers of the tensioner 40, note that three roller guides are mounted on shafts 52, a narrow center roller pad 66 that contacts the middle segment 62 of the carrier wire elements 64 leaving the wings 60 free, and side guides 68 that, along with the central belt divider wall 36, keep the belts from wandering laterally on the rollers.

FIG. 7 shows in more detail the path of the belt 20 on its return path, Arrow B, through the drive section 38 and the tensioner/take-up section 40. Note that the shaft 58 of the wrap drum 46 is rotatably mounted on wrap arm 88, which is pivoted at one end 90. The optional ram 92 can raise or lower the arm 88 as shown by the double-ended Arrow W, which results in an adjustment to the amount of wrap of the belt around the friction drive drum 50. The greater the amount of wrap, the more frictional engagement of the drive drum pad with the bottom of the belt, permitting the drive to pull the belt through the furnace from the front end (the right end as seen in FIG. 1).

In addition, FIG. 7 shows the operation of the pendant loop 56 in the tensioner assembly 40. The belt exits the drive drum 50 and passes over a first tensioner roller 52A, and then descends into loop 56, after which is passes over the second tensioner roller 52B, down to the lower roller 54 which redirects it back to the entry end of the furnace. A heavy free floating roller 86 is positioned in the bottom of the loop to provide tension force to the belt by its mass. As shown, the roller 86 can rise or fall a distance shown by double-ended Arrow S between position S-1 at the bottom to S-2 in an elevated position. The roller is carried on a shaft that is free to rotate in slots 112 in the outer side walls of the tensioner assembly 40 (seen in FIGS. 4-6). Each lane has its own dedicated roller for its own loop. The other end of each roller shaft is free to rotate in a corresponding slot in the land divider walls 36 (not shown).

Figure 10A:
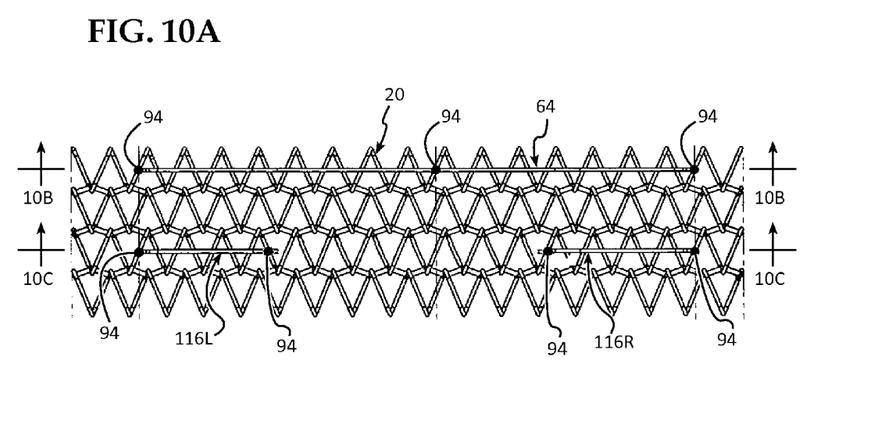
FIG. 10A is a plan view of a typical spiral wire mesh belt used to transport wafers.
Figure 10B:
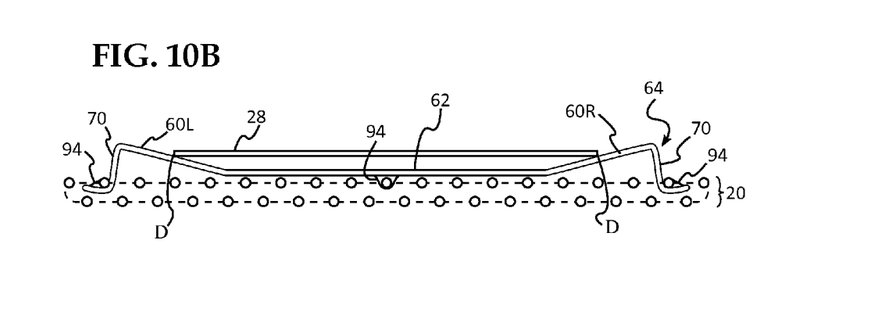
FIG. 10B is a vertical elevation view taken through line 10B-10B of FIG. 10A showing how the carrier wire is positioned on and welded to the belt mesh.
Figure 10C:
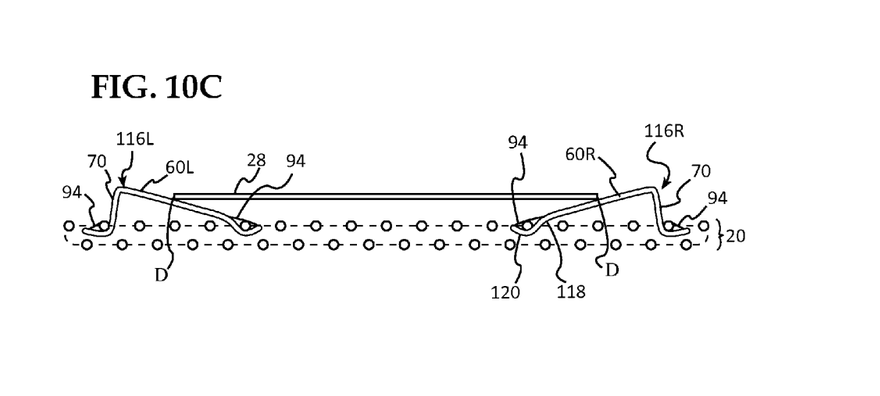
FIG. 10C is a vertical elevation taken through line 10C-10C of FIG. 10A showing a second, wing, embodiment of the carrier wire not having a center section.

FIGS. 8, 10A, 10B and 10C show in more detail the construction of belts 20 having mounted, on an upper side, a plurality of carrier wire elements 64, in this implementation, shown as a continuous carrier wire element that substantially spans the width of the belt 20 (FIGS. 10A and 10B), and a wing embodiment (FIGS. 10A and 10C). The carrier wire elements 64 comprise vertical end segments 70, the base ends of which are welded at 94 to the mesh of the belt. The upper ends of the vertical segments are turned inwardly toward the center of the mesh belt 20, and slanted downwardly to form an inclined segment 60. The inner ends of the inclined segments are joined by a center segment 62 which is preferably welded at 94 at its center point to the center of the belt.

As seen in FIGS. 8, 10A, 10B and 10C, the wafers 28 are planar, on the order of 0.0130" to 0.0200" in thickness and generally rectangular, being bounded by a leading edge 72, a trailing edge 74, a right side edge 76, a left side edge 78, a top surface 80 and a bottom surface 82. Typically the carrier wire elements 64 are spaced apart with respect to the work-piece being transported, here wafers 28, so that there are two or more inclined work piece product support segments supporting the wafer along an edge defined by the intersection of the bottom surface 82 and a side edge, 76 or 78 as the case may be. In the case of a 6" silicon wafer, 3 or 4 inclined wire segments support each side/bottom edge of the wafer so that it is transported stable and level through the process zones. Thus, the chain links are on the order of 2-4 cm in length and the carrier wires are spaced similarly.

Since the carrier wire inclined product support segment 60 is round in cross section, and the wafer 28 is planar and oriented horizontal with the side edges 76 and 78 being vertical, the juncture of the bottom surface 82 with the side edges 76, 78 is a line. Thus, each wafer side/bottom edge juncture line 82/76 and 82/78 intersects the circumference of the inclined segment of the carrier wire in a tangent. The result is only point contact of the wafer with the carrier wire transport mechanism, this point being identified as D in FIGS. 8, 10B and 10C. Of course, multiple inclined product support segments engage each side/bottom edge of the wafer, it being preferred that at least two points of contact are maintained on each side/bottom edge of each wafer during transport throughout the entire length of the processing zone(s) of the particular unit.

Figure 8:
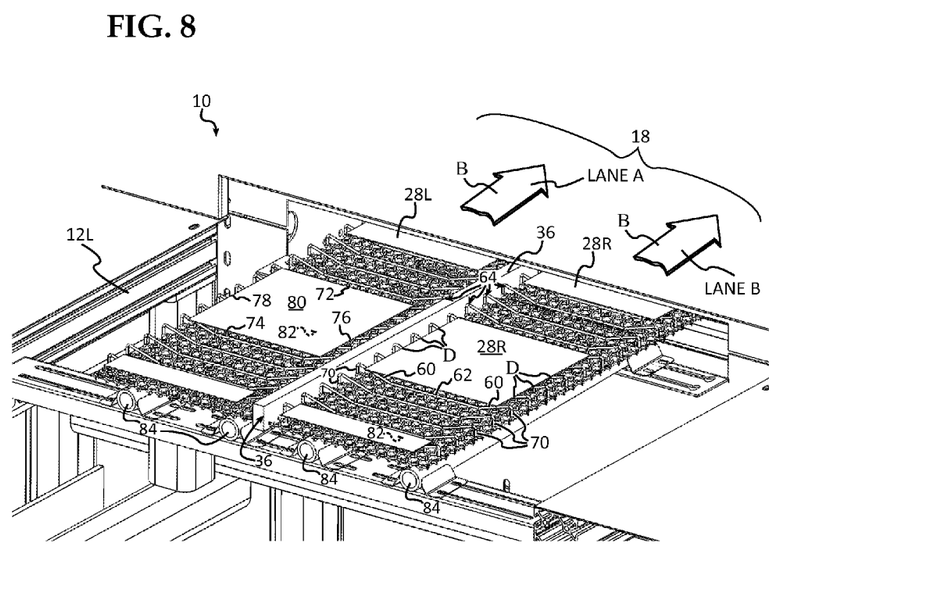
FIG. 8 is a transverse isometric section through the dual side-by-side embodiment, showing the belt supports, the lane divider wall and more detail of how the wafers are supported on the inclined segments as they travel through the various furnace zones during processing.

As seen in FIG. 8, the bottom of the belts 20 slide on conventional quartz tube supports 84 that are arrayed in the standard converging or diverging arrangement to prevent shadowing of the underside of the wafers during processing. FIGS. 2, 3 and 8 also show the dividing wall 36 that functions to isolate the respective work piece product line paths, Lanes A and B, from each other so that by controlling the rate of transport of work pieces in each product line path individually of the other path(s) while exposing at least one face of the wafer work pieces to high intensity IR radiation to heat treat them for a preselected duration and by controlling the temperature in each zone of each product line, either independent of, or in synchrony with, another of said lines, a unique thermal profile is selectively provided along each product line processing path through the furnace heating zones, the thermal profile being configured for a particular product, e.g. wafer type, size, and in the case of a doped wafer, different doping compounds, being processed in the furnace. In this method, transit time through the peak firing zone in a metallization furnace implemented with the multi-line conveyor work piece transfer systems of this invention can be shortened to on the order of 1 second or less. The throughput and yield of high performance wafers is greatly increased by the present invention.

Figure 9:
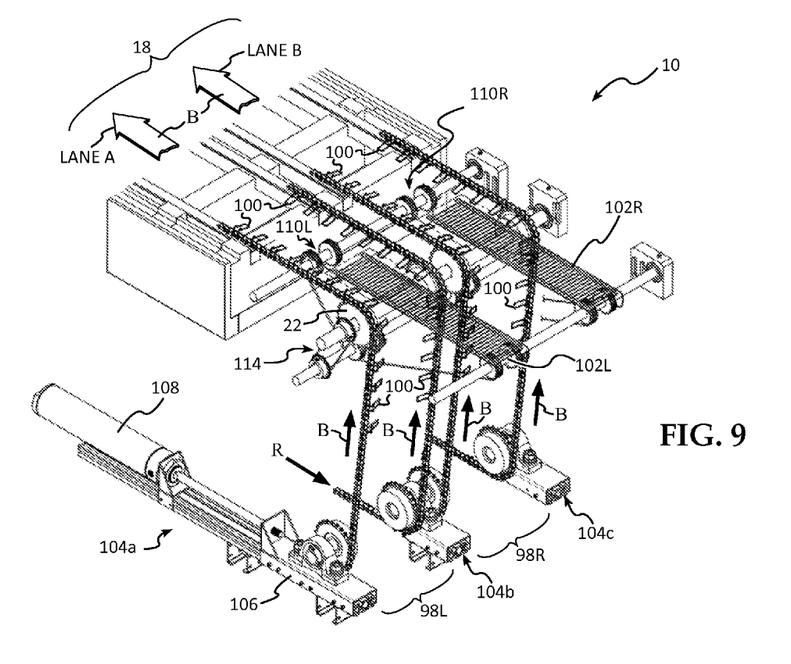
FIG. 9 is an isometric view of the inlet end of a second embodiment of the inventive furnace multi-line independent transport system implemented with finger chain drive assemblies.

FIG. 9 shows an alternate embodiment from the front, entry end of the furnace 10, in which the multi-belt drive system 18 includes pairs of spaced massless, shadowless finger drive chain transports 98R and 98L moving in the direction of Arrows B passing into the furnace over entry zone idler sprockets 22. Each chain member of a pair carries fingers 100 projecting inwardly toward each other with an open space between. The chains travel on sliders in guide tracks of each lane, here Lane A and Lane B of the drive system 18 with the wafers supported along their lower side edges by point contact with the fingers. Wafers are introduced to drives 98L and 98R by corresponding entry transfer belts 102R and 102L, which are narrower than the width of the wafers so the rising fingers 100 of the finger drives 98L, 98R have clearance to gently pick up the wafers. The forward ends 110L, 110R of the transfer belts 102L, 102R are inward of the idlers 22 to permit adjustment for gentle pick-up of wafers by the fingers 100. The transfer belts are driven by chain and sprockets drives 114 that are slaved to the idler sprocket shafts so that the transfer belts synchronously move at the same speed as the finger/chain drives. Note that the massless finger/chain drives are also shadowless, in that no quartz tube supports of the type shown in FIG. 8 (item 84) for mesh belts are required.

In this embodiment, the chains are tensioned at the entry end by entry tensioner assem-blies 104a, 104b, etc (only 104a being shown to not clutter the drawing). These tensioners comprise a sliding sprocket assembly 106 that is biased by a pneumatic or hydraulic ram 108, or alternatively by a linear actuator. The ram 108 slides the sprocket assembly 106 to the right to increase tension, and to the left to decrease tension on the chain. Each finger/chain drive 98 may have its own, independently adjustable tensioner assembly 104. Typically one ram tensions both chains of a drive pair simultaneously.

FIG. 10C shows in vertical section view taken along the line 10C-10C in FIG. 10A an alternate embodiment of the carrier wire assembly 116R, 116L, this embodiment not having a center wire section 62, and comprising two separate inclined wire wings 60R and 60L that are spaced apart a sufficient distance to support the wafer 28 approximately half way up the slanted product support members 60R and 60L. As in the first embodiment of FIG. 10B, the outwardly bent tails of vertical riser segments 70 are welded at 94 to the woven wire mesh belt. The inner ends, proximate of the sloped portion, terminate in a shoulder 118 and a curved inner tip 120 configured to fit under a belt mesh wire as shown, to which it is welded at 94. As seen in plan view in FIG. 10A in this embodiment, four welds are used.

FIG. 11 shows the inverted belt 20 of the first embodiment as it passes over the wrap roller 46, the pad 96 being of a thickness sufficient to permit the carrier wire, raised side "wings" 60 clear the surface of the drum or shaft 58.

The invention includes the method of transporting thin work pieces during process by only point contacts along the intersection of a work piece bottom surface and side edges.

INDUSTRIAL APPLICABILITY:

It is clear that the inventive dual independent transport system of this application has wide applicability to the processing industry, namely to Si wafer processing and the like. The system clearly improves throughput by having a more compact footprint than two separate furnaces. Thus, the inventive system has the clear potential of becoming adopted as the new standard for apparatus and methods of transporting thin work-pieces through processing zones.

It should be understood that various modifications within the scope of this invention can be made by one of ordinary skill in the art without departing from the spirit thereof and without undue experimentation. For example, the shape of the carrier wire elements can have a wide range of designs to provide the functionalities disclosed herein. Likewise the inventive belt drive system is not restricted to only dual lane geometry, being easily adapted to be multi-lane, and may use either wire mesh belts or the massless, shadowless finger/chain drive system. This invention is therefore to be defined by the scope of the appended claims as broadly as the prior art will permit, and in view of the specification if need be, including a full range of current and future equivalents thereof.

The invention claimed is:

1. An improved IR furnace having multiple work piece transport lanes comprising in operative combination:

a) a furnace framework supporting at least one longitudinal heating zone assembly, each said heating zone assembly having an upper and a lower portion defined above and below, respectively, a horizontal work piece transport path, and said assembly having jacks disposed to provide relative vertical motion of said upper and lower heating zone portions, above and below, respectively, said horizontal work piece path, to provide access into said heating zone;

b) a plurality of continuous longitudinal conveyor transport systems disposed in said framework in side-by-side relationship, each said transport systems being configured to transport work pieces along said horizontal path in a first direction from an inlet end of said furnace through said heating zone of said furnace for IR heat treatment of at least one surface of said work piece, to an exit end of said furnace, and thence on a conveyor return path from said exit end back to said inlet end;

c) each of said transport systems having individually controllable conveyor drive and conveyor tensioning systems disposed in said conveyor return path; and d) a controller for controlling the rate of movement of work pieces through said heating zones by said drive in a first line either independent of, or in synchrony with, a second of said lines so as to provide a unique thermal profile along the entire processing path through said heating zones configured for a particular work piece being processed in said furnace.

2. An improved furnace as in claim 1 wherein said conveyors are selected from at least one of wire mesh belts and finger chains.

3. An improved furnace as in claim 2 wherein said conveyor is a wire mesh belt having a plurality of longitudinally spaced-apart carrier-wire elements configured to support thin work pieces only along the intersection of the bottom of the work-piece and its side edges in substantially point contacts during processing transport.

4. An improved furnace as in claim 3 wherein said conveyor wire mesh belt is medially supported between side edges by slider elements disposed in said lower heating zone portions.

5. An improved furnace as in claim 2 wherein said conveyors each comprise a pair of finger chains spaced on each longitudinal side of said processing path and synchronously driven by said drive system, said chains including fingers directed laterally toward each other, said fingers terminating short of a vertical centerline of said processing path to provide a gap there-between, and said fingers being configured to support thin work pieces only along the intersection of the bottom of the work-piece and its side edges in substantially point contacts during processing transport.

6. An improved furnace as in claim 3 wherein said carrier-wire elements comprise a pair of spaced-apart side wings including a work piece support portion slanted inwardly and downwardly toward a centerline of said belt, said wings being secured to said wire mesh belt at the bottom of an outboard riser portion and medially of the sides of said belt.

7. An improved furnace as in claim 6 wherein said work piece support portions of said wings are joined by a continuous wire portion that is secured to said belt at said medial location.

8. An improved furnace as in claim 3 wherein said drive system comprises a first, individually and independently controlled motor-driven drive drum and a second, non-driven wrap drum, said wrap drum being disposed in immediate upstream position in a pinch-roller relationship to said drive drum to insure frictional gripping of said belt by said drive drum, and said tensioner system is disposed immediately downstream of said drive system, said tensioner system includes a gravity loop formed between longitudinally spaced elevated idler rollers and having a vertically free-floating roller disposed in said loop to provide belt tension.

9. An improved furnace as in claim 8 wherein said belt is air cooled at said drive system drums.

10. An improved furnace as in claim 8 wherein said carrier-wire elements comprise a pair of spaced-apart side wings including a work piece support portion slanted inwardly and down-wardly toward a centerline of said belt, and said wrap drum includes a pad on the surface thereof, the width of said pad being no wider than the spacing between the opposed inner ends of said carrier wire slanted product support portions, so that said work piece support portions are not deformed by pressure of said wrap drum.

11. An improved furnace as in claim 1 wherein radiation heating is provided in said heating zones by arrays of high intensity IR lamps, said furnace is a top-lift furnace and said drive and tensioner systems are disposed below a fixed lower portion of at least one of said heating zones in the return path of said conveyor.

12. An improved furnace as in claim 11 which comprises dual conveyor transport systems arranged in side-by-side lanes separated by a conveyor divider wall in a common furnace framework, said furnace heating zones portions span laterally across both conveyor transport systems and have a longitudinal separator in at least one of said portions to isolate individual heating zones for each conveyor that can be independently controllable.

13. An improved furnace as in claim 5 wherein said drive system comprises a motor driven sprocket assembly, and said tensioner system is disposed adjacent the inlet end of said furnace in said return path.

14. An improved furnace as in claim 1 which includes an inlet and an outlet transfer conveyor for introducing work pieces onto the inlet end of said furnace conveyor systems and removing heat treated work pieces from the outlet end of said furnace conveyor systems.

15. A method of processing work pieces traversing at least one transport line in a heat treating furnace having a framework supporting a plurality of sequentially arrayed longitudinal heating zone assemblies having an upper and a lower portion defined above and below, respectively, a horizontal product transport path, and said assemblies having jacks disposed to provide relative vertical motion of said upper and lower heating zone portions, above and below, respectively, said horizontal product path, to provide access into said heating zone, comprising the steps of:

a) transporting a plurality of thin work pieces arrayed in at least a pair of side-by-side processing paths, each defining an independent product line within said framework along said horizontal work piece path in a first direction from an inlet end of said furnace through said heating zone of said furnace for heat treatment of at least one surface of said work pieces, to an exit end of said furnace, and thence on a conveyor return path from said exit end back to said inlet end;

b) isolating said product line processing paths from each other;

c) controlling the rate of transport of work pieces in each product line path individually of the other path(s);

d) exposing at least one face of said work pieces to high intensity IR radiation to heat treat said work pieces for a preselected duration while being transported through said heat treating zones;

e) controlling the temperature in each zone of each product line either independent of, or in synchrony with, another of said lines, so as to provide a unique thermal profile along each product line processing path through said heating zones said thermal profile being configured for a particular product being processed in said furnace.

16. A work piece processing method as in claim 15 wherein said transporting of thin work pieces during processing includes supporting said work pieces at only point contacts along the intersection of a work piece bottom surface and side edges.

17. A work piece processing method as in claim 16 wherein said transporting step includes conveying said thin work pieces supported on at least one of wire mesh belts and finger chains.

18. A work piece processing method as in claim 17 wherein said work pieces are transported on wire mesh belts, said belts including carrier wires configured to support said work pieces above said belt while contacting said work pieces at only said point contacts.

19. A work piece processing method as in claim 16 wherein said furnace includes a plurality of longitudinal heating zone assemblies including at least one pre-heat zone, one peak firing zone, and one cool-down zone for each line.

20. A work piece processing method as in claim 19 which includes controlling said rate of transport of work pieces through said peak firing zone to provide a transit time on the order of no more than about 1 second.

\* \* \* \* \*